United States Patent
Baek et al.

(10) Patent No.: US 11,744,110 B2
(45) Date of Patent: Aug. 29, 2023

(54) DISPLAY APPARATUS AND METHOD OF MANUFACTURING THE SAME

(71) Applicant: Samsung Display Co., Ltd., Yongin-si (KR)

(72) Inventors: Jongjun Baek, Yongin-si (KR); Jaewoo Jeong, Yongin-si (KR); Byungsoo So, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/317,304

(22) Filed: May 11, 2021

(65) Prior Publication Data

US 2021/0265440 A1 Aug. 26, 2021

Related U.S. Application Data

(62) Division of application No. 16/535,336, filed on Aug. 8, 2019, now Pat. No. 11,024,689.

(30) Foreign Application Priority Data

Oct. 31, 2018 (KR) .......................... 10-2018-0132563

(51) Int. Cl.
*H10K 59/121* (2023.01)
*H01L 29/16* (2006.01)
(Continued)

(52) U.S. Cl.
CPC ....... *H10K 59/1213* (2023.02); *H01L 29/045* (2013.01); *H01L 29/1604* (2013.01);
(Continued)

(58) Field of Classification Search
CPC ............. H01L 27/3262; H01L 27/3248; H01L 29/045; H01L 29/1604; H01L 29/78675;
(Continued)

(56) References Cited

U.S. PATENT DOCUMENTS

| 6,541,822 B2 | 4/2003 | Bae et al. |
| 7,589,383 B2 | 9/2009 | Yanase |

(Continued)

FOREIGN PATENT DOCUMENTS

| JP | 11-283922 | 10/1999 |
| JP | 2005-72461 | 3/2005 |

(Continued)

OTHER PUBLICATIONS

I. R. Sanders et al., "The Effect of Argon Implantation on the Conductivity of Boron Implanted Silicon", Solid-State Electronics, 1977, pp. 703-707, vol. 20.

(Continued)

*Primary Examiner* — Marc Anthony Armand
(74) *Attorney, Agent, or Firm* — Kile Park Reed & Houtteman PLLC

(57) ABSTRACT

A display apparatus includes a substrate, a first thin film transistor on the substrate, the first thin film transistor including an active layer including a source region, a drain region, and a channel region between the source region and the drain region, and a display device on the substrate and electrically connected to the first thin film transistor. The source region, the drain region, and the channel region include a first dopant and a second dopant, the second dopant being different from the first dopant. A concentration of the first dopant in the channel region is less than a concentration of the first dopant in the source region and the drain region.

13 Claims, 7 Drawing Sheets

(51) Int. Cl.
*H01L 29/04* (2006.01)
*H01L 29/786* (2006.01)
*H10K 50/12* (2023.01)
*H10K 50/165* (2023.01)
*H10K 59/123* (2023.01)
*H10K 71/00* (2023.01)

(52) U.S. Cl.
CPC ....... *H01L 29/78675* (2013.01); *H10K 50/12* (2023.02); *H10K 50/165* (2023.02); *H10K 59/123* (2023.02); *H10K 71/00* (2023.02)

(58) Field of Classification Search
CPC .............. H01L 29/78618; H01L 29/36; H01L 29/66757; H10K 59/1213; H10K 59/1201; H01K 50/12; H01K 50/165; H01K 50/11
See application file for complete search history.

(56) References Cited

U.S. PATENT DOCUMENTS

| | | | |
|---|---|---|---|
| 2007/0126000 A1* | 6/2007 | Lin | ............... H01L 27/1285 257/E27.111 |
| 2010/0224881 A1 | 9/2010 | Park et al. | |
| 2011/0037073 A1* | 2/2011 | Ahn | ............... H01L 21/02422 257/66 |
| 2013/0017630 A1 | 1/2013 | Jin et al. | |
| 2018/0114822 A1* | 4/2018 | Kim | ............... H10K 59/124 |

FOREIGN PATENT DOCUMENTS

| | | |
|---|---|---|
| JP | 2006-332400 | 12/2006 |
| KR | 1999-0055140 | 7/1999 |
| KR | 10-0373851 | 2/2003 |
| KR | 10-0560793 | 3/2006 |
| KR | 10-1225347 | 1/2013 |

OTHER PUBLICATIONS

Lurng Shehng LEE et al., "Argon Ion-Implantation on Polysilicon or Amorphous-Silicon for Boron Penetration Suppression in p+ pMOSFET", IEEE Transactions on Electron Devices, Aug. 1998, pp. 1737-1744, vol. 45, No. 8.

* cited by examiner

DISPLAY APPARATUS AND METHOD OF MANUFACTURING THE SAME

CROSS-REFERENCE TO RELATED APPLICATION(S)

This is a divisional application of U.S. patent application Ser. No. 16/535,336, filed Aug. 8, 2019 (now U.S. Pat. No. 11,024,689), the disclosure of which is incorporated herein by reference in its entirety. U.S. patent application Ser. No. 16/535,336 claims priority to and benefit of Korean Patent Application No. 10-2018-0132563 under 35 U.S.C. § 119, filed on Oct. 31, 2018, in the Korean Intellectual Property Office, the entire contents of which are incorporated herein by reference.

BACKGROUND

1. Field

One or more embodiments relate to a display apparatus and a method of manufacturing the display apparatus. and more particularly, to a display apparatus capable of improving image quality by improving device properties and a method of manufacturing the display apparatus.

2. Description of the Related Art

As a display field for visually expressing various electrical signal information has rapidly developed, various flat panel display apparatuses having excellent characteristics such as a small thickness, light weight, and low power consumption, etc. have been researched and developed. An organic light-emitting display apparatus that is a self-emissive display apparatus does not need an additional light source, and thus, may be operated with a low voltage and may have a light weight and small thickness. In addition, the organic light-emitting display apparatus is being highlighted as a next generation display apparatus due to its excellent characteristics such as wide viewing angles, high contrast, fast response speeds, etc.

An organic light-emitting display apparatus includes a plurality of pixels. Pixels of an organic light-emitting display apparatus operating in an analog driving method adjust brightness thereof according to a magnitude of input voltage or current data to express gray levels, and pixels of an organic light-emitting display apparatus operating in a digital driving method emit light of the same brightness but have different emission time periods to express gray levels.

A display apparatus includes a thin film transistor and a capacitor and drives a plurality of pixels by using the above devices and controls light emission of the pixels.

SUMMARY

Embodiments are directed to a display apparatus including a substrate, a first thin film transistor on the substrate, the first thin film transistor including an active layer including a source region, a drain region, and a channel region between the source region and the drain region, and a display device on the substrate and electrically connected to the first thin film transistor. The source region, the drain region, and the channel region include a first dopant and a second dopant, the second dopant being different from the first dopant. A concentration of the first dopant in the channel region is less than a concentration of the first dopant in the source region and the drain region.

The first dopant may be a p-type dopant.

The second dopant may be inert gas ions.

A concentration of the second dopant may be uniform in the source region, the drain region, and the channel region.

The first thin film transistor may further include a gate electrode, a source electrode, and a drain electrode, the source electrode and the drain electrode respectively being connected to the source region and the drain region. The display device may include a first electrode electrically connected to one of the source electrode and the drain electrode, and a second electrode facing the first electrode.

The display device may further include an intermediate layer between the first electrode and the second electrode, the intermediate layer including an emission layer.

The active layer of the first thin film transistor may include polycrystalline silicon. The display apparatus may further include a second thin film transistor including an oxide semiconductor.

The substrate may be a flexible substrate.

Embodiments are also directed to a method of manufacturing a display apparatus, the method comprising forming a thin film transistor on a substrate, the thin film transistor including an active layer including a source region, a drain region, and a channel region between the source region and the drain region, and forming a display device electrically connected to the thin film transistor. Forming the thin film transistor may include forming an amorphous silicon layer on the substrate, doping the amorphous silicon layer with a first dopant and a second dopant, the second dopant being different from the first dopant, crystallizing the amorphous silicon layer, and forming the active layer by patterning the silicon layer that is crystallized.

Forming the thin film transistor may further include forming a gate electrode on the active layer, forming the source region, the drain region, and the channel region on the active layer by doping the active layer with the first dopant by using the gate electrode as a mask, and forming a source electrode and a drain electrode that are respectively connected to the source region and the drain region. Forming the display device may include forming a first electrode that is electrically connected to one of the source electrode and the drain electrode and forming a second electrode facing the first electrode.

Forming the display device may further include forming an intermediate layer between the first electrode and the second electrode, the intermediate layer including an emission layer.

The first dopant and the second dopant may be dispersed in the amorphous silicon layer simultaneously with crystallizing the amorphous silicon layer.

Crystallizing the amorphous silicon layer may be at a temperature of about 350° C. to about 450° C.

The first dopant may be a p-type dopant.

The second dopant may be inert gas ions.

Doping the second dopant may be performed after doping the first dopant.

A mass of the second dopant may be greater than a mass of the first dopant.

The amorphous silicon layer may be completely doped with the first dopant and the second dopant before crystallizing the amorphous silicon layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
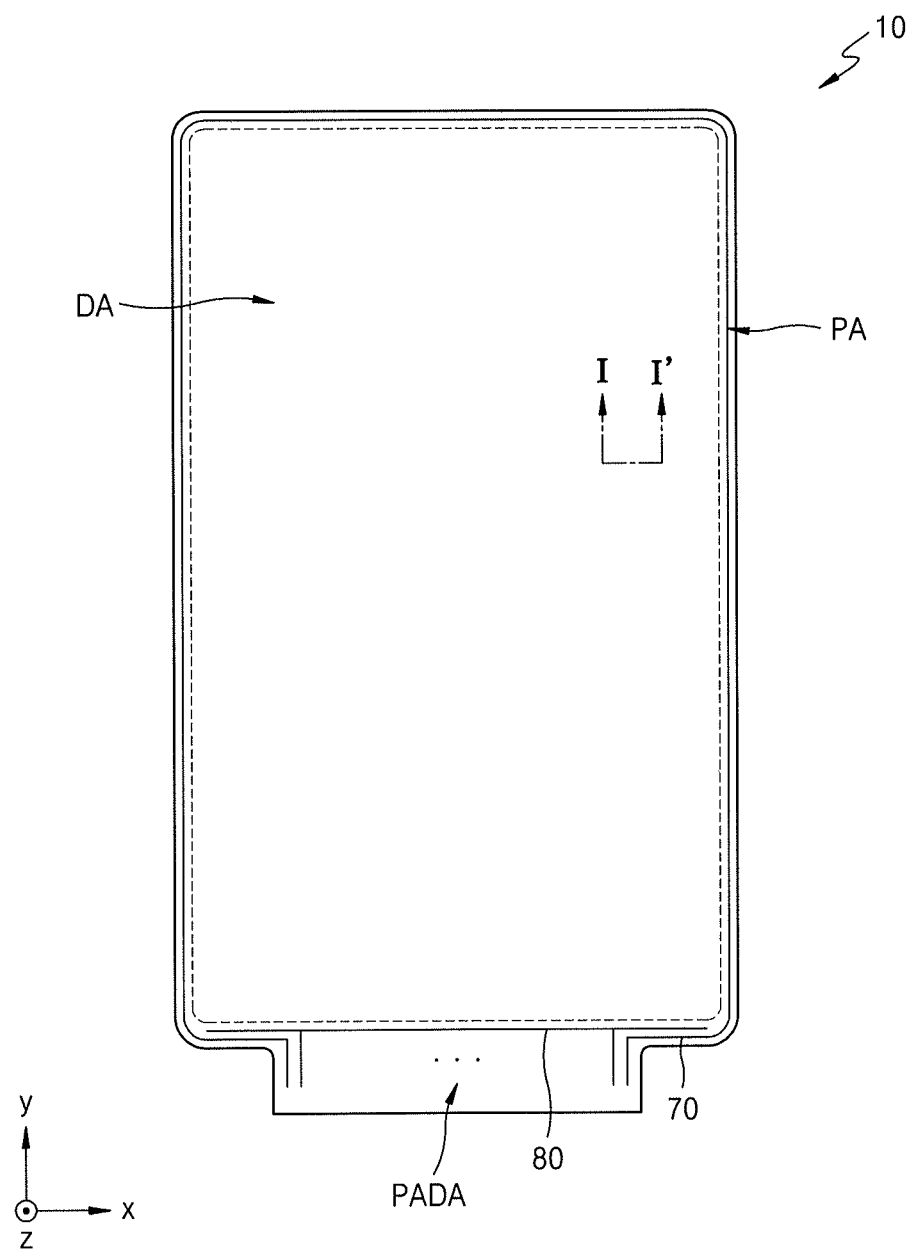
FIG. 1 illustrates a plan view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first" and "second" are used herein to describe various elements, these elements should not be limited by these terms. Terms are only used to distinguish one element from other elements.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
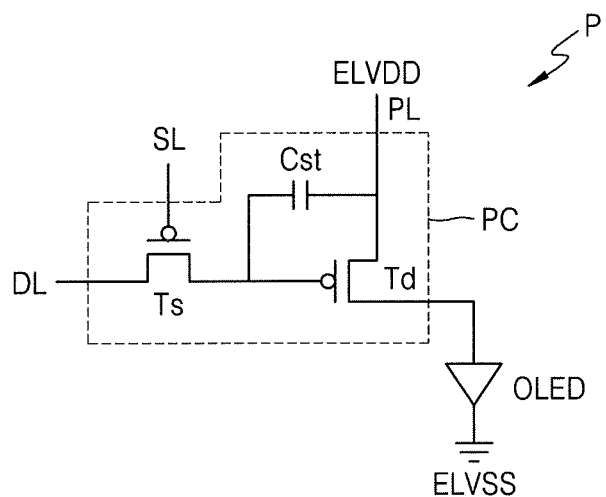
FIG. 2 illustrates an equivalent circuit diagram of one pixel in a display apparatus according to an embodiment.

FIG. 1 illustrates a plan view of a display apparatus 10 according to an embodiment, and FIG. 2 illustrates an equivalent circuit diagram of one pixel in the display apparatus 10 according to the embodiment.

Referring to FIG. 1, the display apparatus 10 according to an embodiment includes a display area DA on which an image is displayed and a peripheral area PA outside the display area DA. The substrate 100 includes the display area DA and the peripheral area PA.

A plurality of pixels P are located in the display area DA. FIG. 2 illustrates an equivalent circuit diagram of one pixel P. Referring to FIG. 2, a pixel P may include a pixel circuit PC connected to a scan line SL and a data line DL and a display device connected to the pixel circuit PC. The display device may include, for example, an organic light-emitting diode OLED.

The pixel circuit PC may include a driving thin film transistor Td, a switching thin film transistor Ts, and a storage capacitor Cst. The switching thin film transistor Ts may be connected to the scan line SL and the data line DL and may transfer a data signal input through the data line DL to the driving thin film transistor Td according to a scan signal input through the scan line SL. The storage capacitor Cst may be connected to the switching thin film transistor Ts and a driving voltage supply line PL and may store a voltage corresponding to a difference between a voltage transferred from the switching thin film transistor Ts and a driving voltage ELVDD supplied to the driving voltage supply line PL.

The driving thin film transistor Td may be connected to the driving voltage supply line PL and the storage capacitor Cst and may control a driving current flowing from the driving voltage supply line PL to the organic light-emitting diode OLED in response to the voltage value stored in the storage capacitor Cst. The organic light-emitting diode OLED may emit light having a predetermined luminance according to the driving current. The organic light-emitting diode OLED may emit, for example, red light, green light, blue light, or white light.

The pixel circuit PC of the pixel P may be variously modified. FIG. 2 shows an example in which the pixel P includes two thin film transistors and one storage capacitor. In some implementations, the pixel circuit PC of the pixel P may include, for example, three or more thin film transistors or two or more storage capacitors.

The peripheral area PA includes a pad area PADA to which various electronic devices, a printed circuit board, etc. are electrically attached. A first voltage line 70 and a second voltage line 80 supplying electric power for driving the display device may be located on the peripheral area PA. The first voltage line 70 may be a common voltage ELVSS line, and the second voltage line 80 may be a driving voltage ELVDD line. The first voltage line 70 may be connected to a common electrode 220 directly or via another wiring, and the second voltage line 80 may be connected to the driving voltage supply line PL.

Figure 3A:
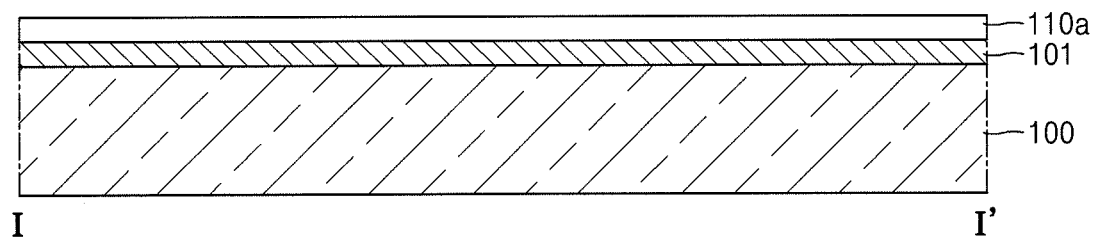
FIGS. 3A to 3I illustrate cross-sectional views taken along line I-I' of FIG. 1, illustrating stages of a process of manufacturing the display apparatus of FIG. 1.
Figure 3B:
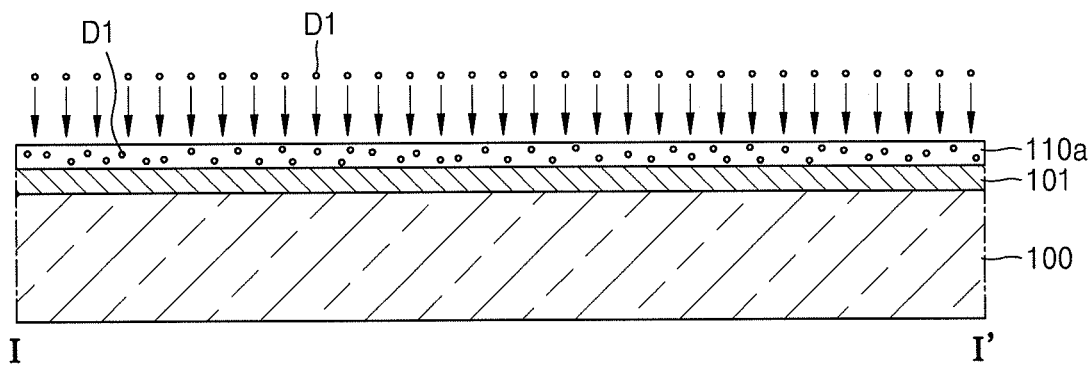
Figure 3C:
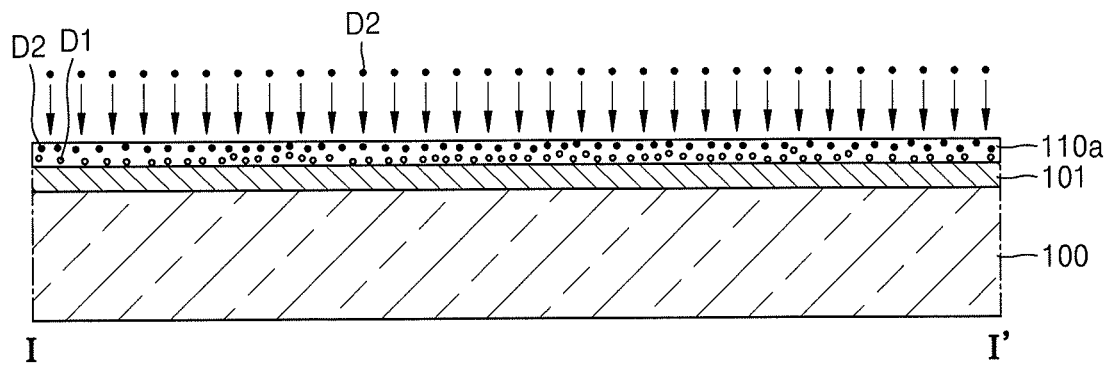
Figure 3D:
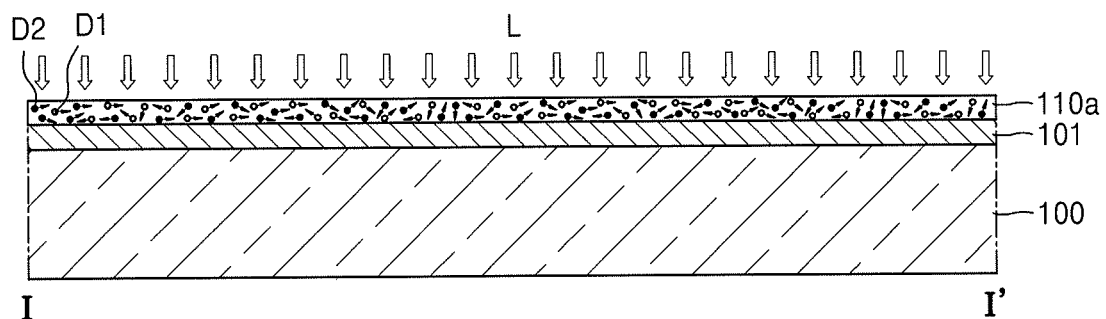
Figure 3D:
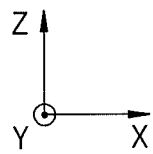
Figure 3E:
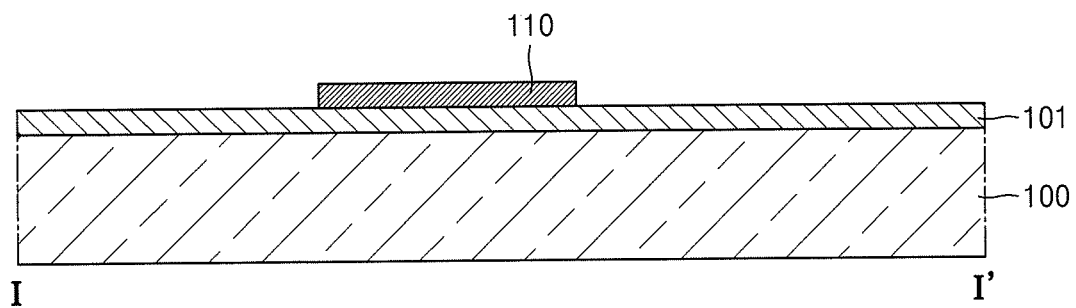
Figure 3E:
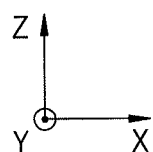
Figure 3F:
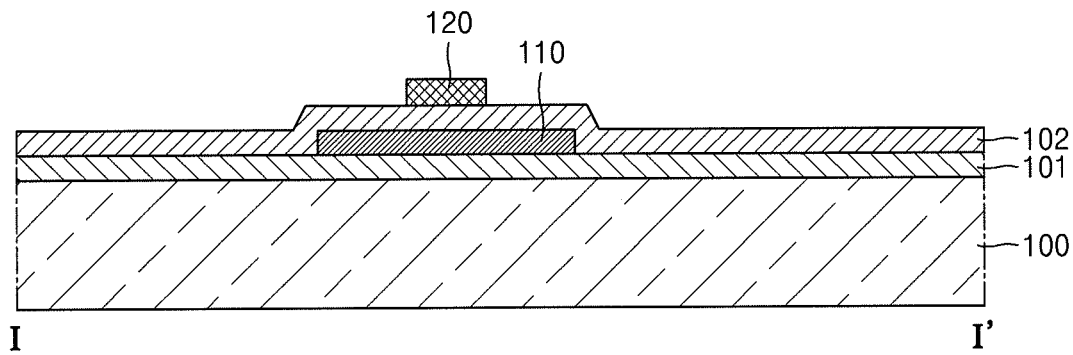
Figure 3F:
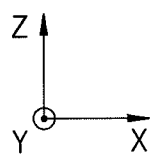
Figure 3G:
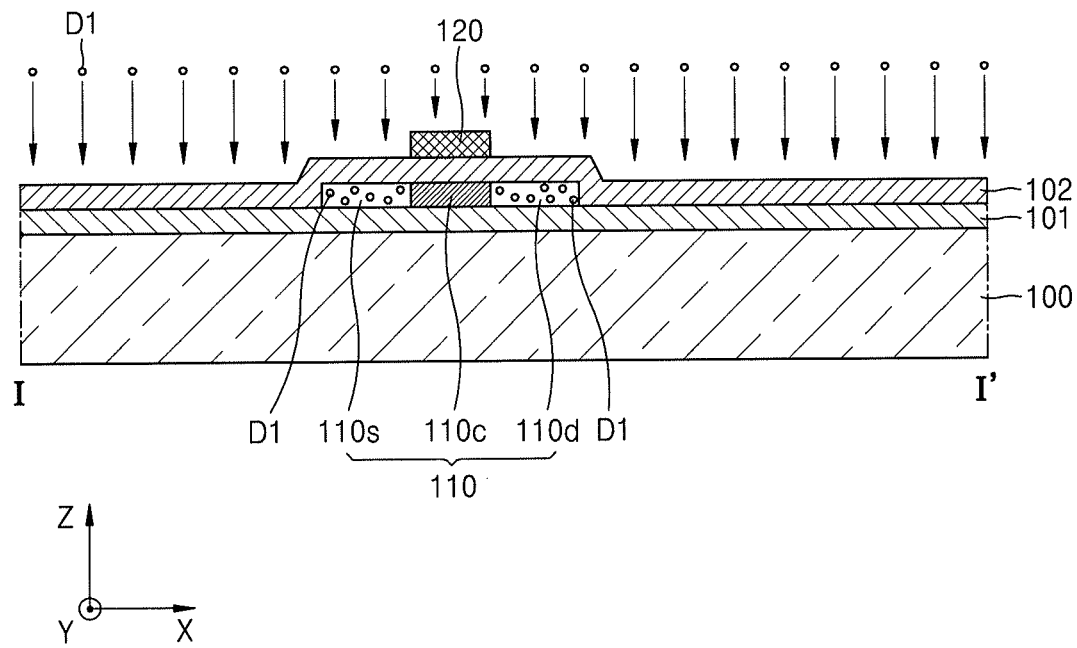
Figure 3H:
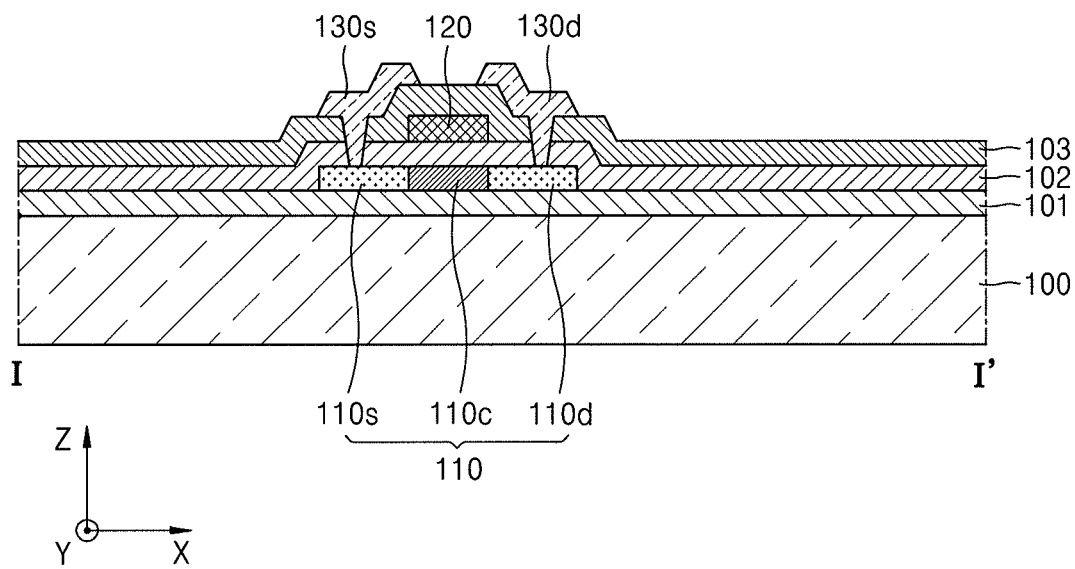
Figure 3I:
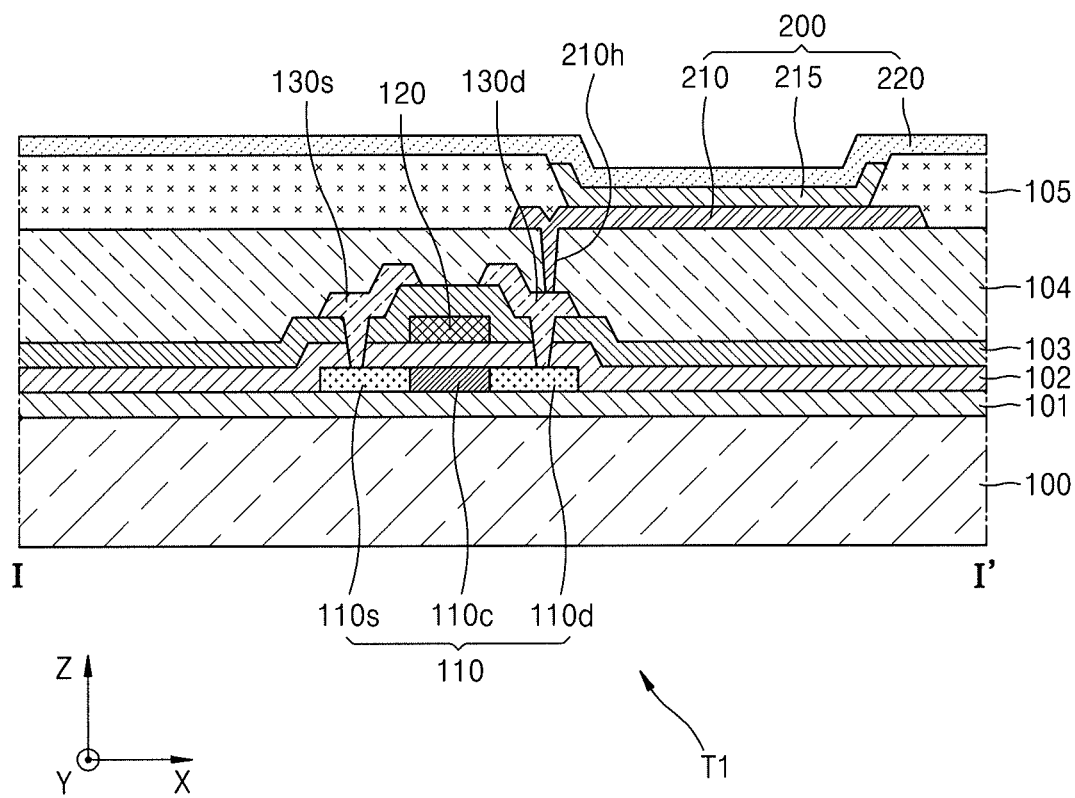

In addition, FIG. 1 may be appreciated as a plan view showing the substrate 100 of FIG. 3I during manufacturing processes of the display apparatus 10. In a final product of the display apparatus 10 or an electronic device such as a smartphone including the display apparatus 10, the substrate 100 may be partially bent in order to reduce an area of the peripheral area PA visible in a plan view by a user. For example, the substrate 100 may be bent between the pad area PADA and the display area DA, and thus, the pad area PADA may at least partially overlap the display area DA. The bending direction may be set so that the pad area PADA is located behind the display area DA, for example, so that the pad area PADA does not cover the display area DA. Accordingly, the user may recognize that the display area DA in a plan view occupies most of the display apparatus 10.

Hereinafter, a structure of the pixel P and processes of manufacturing the pixel P will be described in detail with reference to FIGS. 3A to 3I.

FIGS. 3A to 3I illustrate cross-sectional views taken along line I-I' of FIG. 1, depicting stages of a process of manufacturing the display apparatus 10 of FIG. 1.

As shown in FIG. 3A, the substrate 100 may be prepared, and an amorphous silicon layer 110*a* may be formed on the substrate 100.

The substrate 100 may include various materials, for example, a glass material, a metal material, a plastic material such as polyethylene terephthalate (PET), polyethylene naphthalate (PEN), polyimide, etc.

As an embodiment, the substrate 100 may include a flexible substrate. For example, the substrate 100 may include polyimide (PI). When the flexible substrate is used, the display apparatus 10 according to the embodiment may be a flexible display apparatus.

The amorphous silicon layer 110a may be formed by depositing amorphous silicon on the substrate 100 by a plasma-enhanced chemical vapor deposition (PECVD) method or a low pressure CVD (LPCVD) method. A buffer layer 101 may be formed on the substrate 100 prior to forming the amorphous silicon layer 110a.

The buffer layer 101 may block impurities or moisture that may try to infiltrate through the substrate 100. The buffer layer 101 may include, for example, an inorganic material, such as silicon oxide (SiOx), silicon nitride (SiNx), and/or silicon oxynitride (SiON), and may have a single-layered or multi-layered structure. The buffer layer 101 may correspond to the display area DA and the peripheral area PA and may be obtained by depositing the above-described inorganic material on the substrate 100 by a CVD or atomic layer deposition (ALD) method.

As shown in FIG. 3B, the amorphous silicon layer 110a may be doped with a first dopant D1.

The amorphous silicon layer 110a may be doped by first dopant D1 by a suitable method, for example, by an ion implantation method. When the ion implantation method is used, the first dopant D1 in an ionized state may be accelerated to tens to hundreds KeV and implanted into the amorphous silicon layer 110a. The first dopant D1 may be doped in a concentration of $1.3 \times 10^{12}$ to $1 \times 10^{13}$ per 1 cm$^3$.

The first dopant D1 may be a p-type dopant or an n-type dopant. The p-type dopant may be, for example boron (B), aluminum (Al), gallium (Ga), or indium (In). The n-type dopant may be, for example phosphorus (P), arsenic (As), antimony (Sb), or bismuth (Bi).

In an embodiment, the first dopant D1 may be a p-type dopant. A case in which the first dopant D1 includes boron (B) as one of the p-type dopants will be described below.

As shown in FIG. 3C, the amorphous silicon layer 110a may be doped with a second dopant D2. For example, the amorphous silicon layer 110a that is already doped with the first dopant D1 may then be doped with the second dopant D2.

As described with respect to the first dopant D1, the ion implantation method may also be used for doping the amorphous silicon layer 110a with the second dopant D2 by. The second dopant D2 may be doped in a concentration of $1 \times 10^{13}$ per 1 cm$^3$.

The second dopant D2 may be different from the first dopant D1. For example, the second dopant D2 may include an inert gas ion. A mass of the second dopant D2 may be greater than that of the first dopant D1. For example, the inert gas may be selected from helium (He), neon (Ne), argon (Ar), krypton (Kr), and xenon (Xe).

As described above, when the inert gas ion is used as the second dopant D2, influence on the device may be reduced and an undesirable chemical reaction on films of the amorphous silicon layer 110a or the buffer layer 101 during the processes may be avoided.

When an inert gas ion having greater mass than that of Xe is used as the second dopant D2, the ion implantation may not be sufficiently performed. Moreover, even when the implantation is performed, the amorphous silicon layer 110a may be damaged. Thus, the second dopant D2 may include a material having a mass less than that of Xe.

As an embodiment, the second dopant D2 may include Ar ions. Hereinafter, a case in which the second dopant D2 includes Ar positive ions (Ar+) will be described below.

The process of doping the first dopant D1 shown in FIG. 3B and the process of doping the second dopant D2 shown in FIG. 3C may be performed before crystallization of the amorphous silicon layer 110a. The amorphous silicon layer 110a may be completely doped with the first dopant D1 and the second dopant D2.

As described above, when the first dopant D1 is entirely implanted into the amorphous silicon layer 110a, the dopant may be included in a channel region, as well as in a source region and a drain region of an active layer in a thin film transistor. Thus, it may be easy to control a threshold voltage Vth of the thin film transistor.

The second dopant D2 that does not generate chemical transformation of the amorphous silicon layer 110a may be additionally implanted. Accordingly, device characteristics such as hysteresis of the thin film transistor may be improved. The second dopant D2 may affect the amorphous silicon layer 110a while being ion-implanted and crystal seeds may be reduced. Crystals having defective ability to crystallize maybe reduced and crystals having excellent ability to crystallize may increase. Fine grains that generate at a relatively low temperature may be broken due to the action of the second dopant D2 while a temperature to crystallize the amorphous silicon layer 110a may be increased. Accordingly, defective crystals may be reduced.

The order of the first dopant D1 doping process and the second dopant D2 doping process may be changed. However, the second dopant D2 having a greater mass than the first dopant D1 is likely to be distributed relatively under the first dopant D1 (e.g., −Z direction), when the second dopant D2 is implanted earlier than the first dopant D1. The second dopant D2 may sink at a bottom side of the amorphous silicon layer 110a and much time and energy may be necessary to activate the second dopant D2 at a later time. Therefore, in some implementations, the second dopant D2 may be implanted later than the first dopant D1 so that the second dopant D2 may be distributed above the first dopant D1. The first and second dopants D1 and D2 may be easily activated and provided uniformly.

As shown in FIG. 3D, the amorphous silicon layer 110a doped with the first dopant D1 and the second dopant D2 may be crystallized.

For example, a laser beam L may be irradiated onto the amorphous silicon layer 110a to increase a temperature of the amorphous silicon layer 110a to a desired temperature. The amorphous silicon layer 110a may be transformed into a polycrystalline silicon layer. A source of the laser beam L may be excimer laser.

When the substrate 100 is a flexible substrate including polyimide (PI), a crystallization temperature may be about 350° C. to about 450° C. If the crystallization were to be performed at a temperature equal to or higher than 450° C., PI, that is, the material included in the substrate, could be damaged. On the other hand, when the crystallization temperature is lower than 350° C., it may be difficult to sufficiently crystallize the amorphous silicon layer 110a.

While the amorphous silicon layer 110a is crystallized, the first dopant D1 and the second dopant D2 may be activated. The temperature of the amorphous silicon layer 110a may increase while the amorphous silicon layer 110a is crystallized. Accordingly, the first dopant D1 and the second dopant D2 implanted in the amorphous silicon layer 110a before the crystallization may be dispersed in the amorphous silicon layer 110a simultaneously with the crystallization of the amorphous silicon layer 110a. The first and second dopants D1 and D2 may be evenly distributed in the amorphous silicon layer 110a without the need to perform an additional thermal treatment for diffusing the first and second dopants D1 and D2. Thus, the polycrystalline silicon layer may have an even doping concentration.

A result corresponding to that of the thermal treatment of the first and second dopants D1 and D2 may be obtained by only crystallizing the amorphous silicon layer 110a without performing an additional thermal treatment. Thus, a processing time and manufacturing costs may be reduced.

Next, as shown in FIG. 3E, the silicon layer crystallized to a polycrystalline silicon layer may be patterned to form an active layer 110.

The silicon layer may be patterned in various ways, for example, by a dry etching method or a wet etching method using photoresist.

As described above, the active layer 110 may include polycrystalline silicon. In some implementations, the thin film transistors may include an active layer having a material other than polycrystalline silicon.

As an embodiment, the driving thin film transistor Td shown in FIG. 2 may include an active layer including polycrystalline silicon. In some implementations, the switching thin film transistor Ts (see FIG. 2) may include an active layer including an oxide semiconductor. The oxide semiconductor may include a metal oxide such as oxides of zinc (Zn), In, Ga, tin (Sn), titanium (Ti), etc., or a mixture of metal such as Zn, In, Ga, Sn, Ti, etc. For example, the oxide semiconductor may include Zn oxide-based material, e.g., Zn oxide, In—Zn oxide, Ga—In—Zn oxide, etc. In some embodiments, the oxide semiconductor may include an IGZO (In—Ga—Zn—O) semiconductor including metal such as In or Ga in ZnO. In some implementations, the active layer of the switching thin film transistor Ts (see FIG. 2) may include an oxide semiconductor, and the active layer of the driving thin film transistor Td (see FIG. 2) may include polycrystalline silicon.

When the active layer of the thin film transistor includes the oxide semiconductor, a low off-current may be exhibited and low-frequency driving may be implemented. When one of the driving and switching thin film transistors Td and Ts includes an oxide semiconductor layer, power consumption of the display apparatus 10 (see FIG. 1) may be reduced.

As shown in FIG. 3F, a gate insulating layer 102 may be formed to cover the active layer 110, and a gate electrode 120 may be formed on the gate insulating layer 102.

The gate insulating layer 102 may insulate the active layer 110 and the gate electrode 120 from each other. To this end, the gate insulating layer 102 may include an insulating layer obtained by depositing an inorganic material such as SiON, SiOx, and/or SiNx by a CVD or ALD method. The above insulating layer including the inorganic material may have a single-layered or multi-layered structure.

The gate electrode 120 may be obtained by patterning a conductive metal that is deposited by a sputtering method or a vacuum evaporation method. The gate electrode 120 may at least partially overlap the active layer 110.

As shown in FIG. 3F, the active layer 110 under the gate electrode 120 may be doped with the first dopant D1 by using the gate electrode 120 as a mask.

The first dopant D1 may not be implanted to a portion of the active layer 110 that overlaps the gate electrode 120, but instead may be implanted into a remaining region of the active layer 110. As such, the active layer 110 may be partitioned into a source region 110s, a drain region 110d, and a channel region 110c between the source and drain regions 110s and 110d. The source region 110s and the drain region 110d may be respectively connected to a source electrode and a drain electrode to be described below.

The first dopant D1 additionally doped in this process may be added to the first dopant D1 previously doped (see FIG. 3B). The concentration of the first dopant D1 in the source region 110s and the drain region 110d of the active layer 110 may increase. As such, the concentration of the first dopant D1 in the channel region 110c may be lower than that in the source region 110s and the drain region 110d.I In order to provide a difference between concentrations of the source and drain regions 110s and 110d and the channel region 110c clear, the first dopant D1 may be doped in a concentration of $1.3 \times 10^{15}$ per 1 $cm^3$.

The second dopant D2 may not be additionally doped. Accordingly, the second dopant D2 may have a uniform concentration throughout the source region 110s, the drain region 110d, and the channel region 110c.

As shown in FIG. 3H, after forming an interlayer insulating layer 103 to cover the gate electrode 120, a source electrode 130s and a drain electrode 130d may be formed on the interlayer insulating layer 103.

The interlayer insulating layer 103 may be obtained by depositing an inorganic material such as SiON, SiOx, and/or SiNx by a CVD or ALD method. The interlayer insulating layer 103 may have a single-layered or multi-layered structure.

Before forming the source electrode 130s and the drain electrode 130d on the interlayer insulating layer 103, a through hole may be provided in the gate insulating layer 102 and the interlayer insulating layer 103. The source region 110s and the drain region 110d of the active layer 110 may be partially exposed through the through hole.

A conductive metal may be deposited on the interlayer insulating layer 103 by a sputtering method or a vacuum deposition method. The conductive metal may be patterned by using a mask, and the source electrode 130s and the drain electrode 130d electrically connected to the source region 110s and the drain region 110d via the through hole may be obtained.

As shown in FIG. 3I, a first thin film transistor T1 including the active layer 110, the gate electrode 120, the source electrode 130s, and the drain electrode 130d is obtained.

As shown in FIG. 3I, a planarization layer 104 may be formed on the first thin film transistor T1. The planarization layer 104 may include a general universal polymer (polymethylmethacrylate (PMMA) or polystyrene (PS)), a polymer derivative having phenol groups, an acryl-based polymer, an imide-based polymer, an aryl ether-based polymer, an amide-based polymer, a fluoride-based polymer, a p-xylene-based polymer, a vinyl alcohol-based polymer, or a blend thereof. As an embodiment, the planarization layer 104 may include PI. The planarization layer 104 may be formed using a vacuum deposition method.

A display device may be formed on the planarization layer 104. As an embodiment, the display device may include an organic light-emitting diode 200. Hereinafter, a case in which the display device is the organic light-emitting diode 200 will be described below.

The organic light-emitting diode 200 may include a pixel electrode 210, a common electrode 220, and an intermediate layer 215 including an emission layer between the pixel electrode 210 and the common electrode 220.

The pixel electrode 210 may contact one of the source electrode 130s and the drain electrode 130d via an opening 210h provided in the planarization layer 104 to be electrically connected to the first thin film transistor T1. As such, the first thin film transistor T1 may function as the driving thin film transistor Td (see FIG. 2). Although not shown in FIG. 3I, the switching thin film transistor Ts (see FIG. 2) may be further provided in addition to the first thin film transistor T1.

A pixel defining layer 105 may be formed on the pixel electrode 210. The pixel defining layer 105 may have an opening corresponding to a pixel P (see FIG. 2), for example, an opening exposing at least a center portion of the pixel electrode 210 to define a light-emission region. The pixel defining layer 105 may increase a distance between an edge of the pixel electrode 210 and the common electrode 220, to prevent the generation of an arc between the pixel electrode 210 and the common electrode 230. The pixel defining layer 105 may include an organic material, for example, polyimide, hexamethyl disiloxane (HMDSO), etc.

The intermediate layer 215 may include a low-molecular weight organic material or a polymer material. When the intermediate layer 215 includes a low-molecular weight material, the intermediate layer 215 may include a hole injection layer (HIL), a hole transport layer (HTL), an emission layer (EML), an electron transport layer (ETL), and an electron injection layer (EIL) in a single or multiple-layered structure. Examples of the low-molecular weight material may include copper phthalocyanine (CuPc), N,N'-di(naphthalene-1-yl)-N,N'-diphenyl-benzidine (NPB), and tris-8-hydroxyquinoline aluminum ($Alq_3$). The above layers may be formed using a screen printing method, an inkjet printing method, a laser induced thermal imaging (LITI) method, etc.

When the intermediate layer 215 includes a polymer material, the intermediate layer 215 may include an HTL and an EML. Here, the HTL may include poly(3,4-ethylenedi-oxythiophene) PEDOT, and the EML may include a poly-phenylenevinylene (PPV)-based or polyfluorene-based polymer material. The intermediate layer 215 may have various structures. For example, the intermediate layer 215 may include at least one layer that is integrally formed throughout a plurality of pixel electrodes 210. In some implementations, the intermediate layer 215 may include a layer that is patterned to correspond to each of the plurality of pixel electrodes 210.

The common electrode 220 may be formed above the display area DA and may cover the display area DA. The common electrode 220 may be integrally provided with respect to a plurality of pixels P (see FIG. 2).

An encapsulation layer may be provided to cover the organic light-emitting diode 200 in order to protect the organic light-emitting diode 200 against external moisture or oxygen. The encapsulation layer may include an inorganic encapsulation layer and an organic encapsulation layer. The inorganic and organic encapsulation layers may be stacked alternately with each other.

The display apparatus 10 (see FIG. 1) manufactured as above may improve various device characteristics, as described in detail below with reference to FIGS. 4 and 5.

Figure 4:
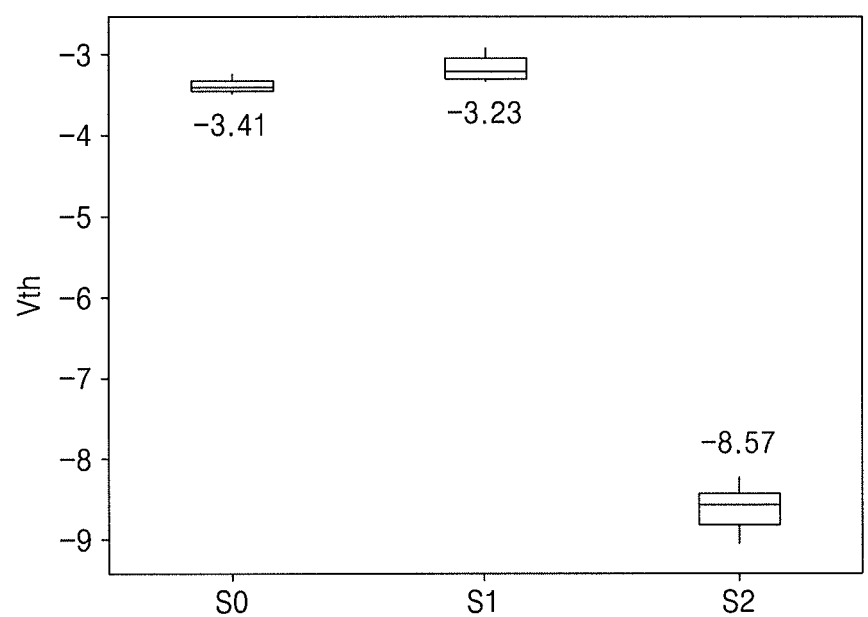
FIGS. 4 and 5 illustrate graphs showing improvement in device characteristics of a display apparatus according to an embodiment.
Figure 5:
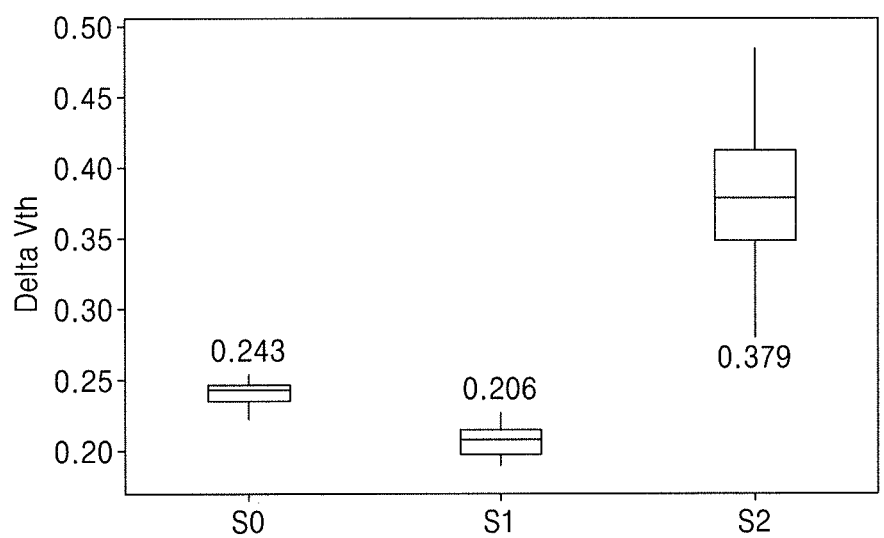

FIGS. 4 and 5 are graphs showing improvement in device characteristics of a display apparatus according to an embodiment.

In the graphs of FIGS. 4 and 5, the transverse axis denotes three samples and the longitudinal axis denotes a measured value of device characteristics.

The three samples include a reference sample S0, a first sample S1, and a second sample S2. The reference sample S0 is a display apparatus in which the amorphous silicon layer is only doped with B (corresponding to the first dopant D1 described above) at a concentration of B is $1.3 \times 10^{12}$ per 1 $cm^3$.

The first sample S1 is a display apparatus according to an embodiment, in which the amorphous silicon layer is doped with both B and Ar ions (corresponding to the second dopant D2 described above), and the doping process is performed before the crystallization of the amorphous silicon layer. In the first sample S1, a doping concentration of B is $1.3 \times 10^{12}$ per 1 $cm^3$, and a doping concentration of Ar ions is $1 \times 10^{13}$ per 1 $cm^3$.

The second sample S2 is a display apparatus according to a comparative example, in which the amorphous silicon layer is doped with both B and Ar ions, and the doping process is performed after the crystallization of the amorphous silicon layer. Like in the first sample S1, in the second sample S2, a doping concentration of B is $1.3 \times 10^{12}$ per 1 $cm^3$ and a doping concentration of Ar ions is $1 \times 10^{13}$ per 1 $cm^3$.

Referring to FIG. 4, according to the reference sample S1, a median value of a threshold voltage Vth is −3.41, and according to the first sample S1, a median value of a threshold value Vth is −3.23. On the other hand, according to the second sample S2, even though the Ar ions are doped in addition to B, the median value of the threshold value Vth is reduced to −8.57.

Next, referring to FIG. 5, in the reference sample S0, a median value of hysteresis (delta Vth), which is defined as a variation in the threshold voltage Vth, is 0.243. In the first sample S1, a median value of the hysteresis (delta Vth) is −3.23. However, in the second sample S2, a median value of the hysteresis (delta Vth) was 0.379 even when Ar ions were doped in addition to B.

Therefore, when B and Ar are all doped before the crystallization process as in the one or more embodiments, the threshold voltage Vth may be reduced and the hysteresis (delta Vth) may be decreased as compared with a case in which B is only doped. As shown in FIG. 5, the display apparatus according to the embodiment (corresponding to the first sample S1) may have the hysteresis (delta Vth) that is improved by 15.1% as compared with the display apparatus (corresponding to the reference sample S0) in which B is only doped and Ar ions are not doped.

On the other hand, in the comparative example (corresponding to the second sample S2) in which B and Ar ions are doped after the crystallization process, the threshold voltage Vth and the hysteresis (delta Vth) both are increased greatly as compared with the display apparatus (reference sample S0).

By way of summation and review, electrical and physical characteristics of a display apparatus are highly relevant with respect to image quality of the display apparatus. One of the significant issues in the field of displays is to improve device characteristics.

Embodiments provide a display apparatus capable of improving image quality by improving device properties and a method of manufacturing the display apparatus.

As described above, according to the display apparatus of the embodiment, the image quality of the display apparatus may be improved by improving characteristics of the devices, and in particular, the afterimage effect may be reduced by decreasing the hysteresis. According to the method of manufacturing the display apparatus of the embodiment, the influence of the improvement in the device characteristic on another device characteristic may be reduced, and accordingly, processing time and manufacturing costs may be reduced.

According to the embodiment, the image quality of the display apparatus may be improved by improving characteristics of the devices.

Also, the occurrence of afterimage due to the hysteresis may be reduced.

In addition, the influence on another device characteristic during the improvement of a certain device characteristic may be reduced.

In addition, processing time and manufacturing costs of the display apparatus may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
a substrate;
a first thin film transistor on the substrate, the first thin film transistor including an active layer including a source region, a drain region, and a channel region between the source region and the drain region; and
a display device on the substrate and electrically connected to the first thin film transistor, wherein
the source region, the drain region, and the channel region include a first dopant and a second dopant, the second dopant being different from the first dopant, and
a concentration of the first dopant in the channel region is less than a concentration of the first dopant in the source region and the drain region.

2. The display apparatus as claimed in claim 1, wherein the first dopant is a p-type dopant.

3. The display apparatus as claimed in claim 1, wherein the first type dopant is an n-type or p-type dopant, and the second dopant is inert gas ions.

4. The display apparatus as claimed in claim 1, wherein a concentration of the second dopant is uniform in the source region, the drain region, and the channel region.

5. The display apparatus as claimed in claim 1, wherein:
the first thin film transistor further includes a gate electrode, a source electrode, and a drain electrode, the source electrode and the drain electrode respectively being connected to the source region and the drain region, and
the display device includes a first electrode electrically connected to one of the source electrode and the drain electrode, and a second electrode facing the first electrode.

6. The display apparatus as claimed in claim 5, wherein the display device further includes an intermediate layer between the first electrode and the second electrode, the intermediate layer including an emission layer.

7. The display apparatus as claimed in claim 1, wherein:
the active layer of the first thin film transistor includes polycrystalline silicon, and
the display apparatus further includes a second thin film transistor including an oxide semiconductor.

8. The display apparatus as claimed in claim 1, wherein the substrate is a flexible substrate.

9. The display apparatus as claimed in claim 1, wherein a concentration of the second dopant is uniform in the source region, the drain region, and the channel region.

10. The display apparatus as claimed in claim 3, wherein the inert gas ions are one of helium (He), neon (Ne), argon (Ar), krypton (Kr) ions, or xenon (Xe) ions.

11. The display apparatus as claimed in claim 10, wherein the inert gas ions are argon ions.

12. The display apparatus as claimed in claim 10, wherein a concentration of the inert gas ions is uniform in the source region, the drain region, and the channel region.

13. The display apparatus as claimed in claim 10, wherein a concentration of the inert gas ions is at least $1\times10^{13}$ per 1 $cm^3$.

* * * * *